United States Patent
Miller et al.

(10) Patent No.: US 8,314,409 B2
(45) Date of Patent: Nov. 20, 2012

(54) PATTERN MODIFICATION SCHEMES FOR IMPROVED FIB PATTERNING

(75) Inventors: Tom Miller, Portland, OR (US); Gene Mirro, Kalama, WA (US); Cornelis Sander Kooijman, Veldhoven (NL); Hendrik Jan de Vos, Eindhoven (NL)

(73) Assignee: FEI Company, Hillsboro, OR (US)

( * ) Notice: Subject to any disclaimer, the term of this patent is extended or adjusted under 35 U.S.C. 154(b) by 10 days.

(21) Appl. No.: 12/870,816

(22) Filed: Aug. 28, 2010

(65) Prior Publication Data

US 2011/0049382 A1 Mar. 3, 2011

Related U.S. Application Data

(60) Provisional application No. 61/238,007, filed on Aug. 28, 2009.

(51) Int. Cl.
*H01J 3/14* (2006.01)

(52) U.S. Cl. ............... 250/492.22; 250/307; 250/396 R; 250/492.1; 250/492.2; 250/492.3

(58) Field of Classification Search .............. 250/306, 250/307, 310, 311, 396 R, 396 ML, 492.1, 250/492.2, 492.22, 492.23, 492.3
See application file for complete search history.

(56) References Cited

U.S. PATENT DOCUMENTS

| | | | |
|---|---|---|---|
| 4,807,159 A * | 2/1989 | Komatsu et al. | 250/311 |
| 5,180,918 A | 1/1993 | Isobe | |
| 5,225,684 A | 7/1993 | Taki et al. | |
| 5,770,863 A | 6/1998 | Nakasuji | |
| 5,916,424 A | 6/1999 | Libby et al. | |
| 6,188,071 B1 | 2/2001 | Gordon et al. | |
| 6,354,438 B1 | 3/2002 | Lee et al. | |
| 6,407,397 B1 * | 6/2002 | Seto | 250/492.22 |
| 6,649,919 B2 | 11/2003 | Chao et al. | |
| 6,661,507 B2 * | 12/2003 | Yoda et al. | 356/237.2 |
| 6,774,379 B2 | 8/2004 | Hashimoto | |
| 7,259,373 B2 * | 8/2007 | Zani et al. | 250/309 |
| 7,368,736 B2 * | 5/2008 | Magoshi | 250/492.22 |
| 7,569,841 B2 | 8/2009 | Hill et al. | |
| 7,601,968 B2 * | 10/2009 | Abe et al. | 250/396 R |
| 2002/0010390 A1 * | 1/2002 | Guice et al. | 600/300 |
| 2006/0255284 A1 * | 11/2006 | Hill et al. | 250/396 R |
| 2008/0314871 A1 | 12/2008 | Toth et al. | |
| 2009/0289196 A1 | 11/2009 | Hill et al. | |
| 2009/0309018 A1 | 12/2009 | Smith et al. | |

FOREIGN PATENT DOCUMENTS

| | | |
|---|---|---|
| JP | 04330713 | 11/1992 |
| JP | 11238671 | 8/1999 |
| JP | 2000077017 | 3/2000 |
| JP | 2006-066212 | 3/2006 |
| JP | 2006203066 A * | 8/2006 |
| WO | 2011025998 | 3/2011 |

* cited by examiner

*Primary Examiner* — Michael Logie
(74) *Attorney, Agent, or Firm* — Scheinberg & Associates, PC; Michael O. Scheinberg

(57) ABSTRACT

An improved method of directing a charged particle beam that compensates for the time required for the charged particles to traverse the system by altering one or more of the deflector signals. According to one embodiment of the invention, a digital filter is applied to the scan pattern prior to digital-to-analog (D/A) conversion in order to reduce or eliminate over-shoot effects that can result from TOF errors. In other embodiments, analog filters or the use of signal amplifiers with a lower bandwidth can also be used to compensate for TOF errors. By altering the scan pattern, over-shoot effects can be significantly reduced or eliminated.

15 Claims, 13 Drawing Sheets

PATTERN MODIFICATION SCHEMES FOR IMPROVED FIB PATTERNING

This application claims priority from U.S. Provisional Application 61/238,007, filed Aug. 28, 2009, which is hereby incorporated by reference.

TECHNICAL FIELD OF THE INVENTION

The present invention relates to charged particle beam systems, such as focused ion beam systems and electron beam systems, more specifically to correcting time-of-flight errors that occur with beams having short dwell times and/or low landing energy.

BACKGROUND OF THE INVENTION

Charged particle beams, such as focused ion beam systems and electron beam systems, direct charged particles onto a work piece for processing the work piece by, for example, milling or forming an image of the work piece. Charged particle beam systems are used, for example, in integrated circuit fabrication and other nanotechnology processing.

Charged particles beam systems typically include a source of particles, a beam blanker, accelerating lenses, focusing optics, and deflection optics. A charged particle source may be, for example, a liquid metal ion source, a plasma ion source, or a thermal field electron emitter, such as a Schottky emitter. A beam blanker interrupts the beam by directing it away from the work piece and into a solid stopping material.

The focusing optics focus the beam into a spot or a pre-defined shape on the surface of a sample. Focusing optics typically include a combination of condenser lenses and an objective lens. The lens can be electrostatic, magnetic, or various combinations of the two. Charged particle lenses, like light lenses, have aberrations that make it difficult to focus the charged particles to form a sharp image. The aberration is least for charged particles passing through the center of the lens, and the aberration increases as the distance from the center of the lens increases. It is desirable, therefore, for the charged particle beam to pass very near the center of the lens. One type of aberration, referred to as "beam interaction" occurs because the particles in the beam, all having the same electrical charge, repel each other. The closer the particles are to each other, the greater the repulsive force. Because the particles are typically converging after passing through the objective lens, it is desirable to position the objective lens as close as possible to the work piece, to reduce the time that the particles are focused in a tight beam. The distance between the objective lens and the work piece is referred to as the "working distance."

The deflection optics direct the beam to points, referred to as "dwell points" or "pixels," on the surface of the work piece. For example, the beam may be directed in a raster pattern, in a serpentine pattern, or toward an arbitrary sequence of individual points. The beam will typically dwell at a point for a specified period, referred to as "dwell period," to deliver a specified "dose" of charged particles, and then be deflected to the next dwell point. The duration of the dwell period is referred to as the "dwell time" or the "pixel rate." (While pixel "rate" more properly refers to the number of pixels scanned per second, the term is also sometimes used to indicate the time the beam remains at each pixel.)

The deflection optics can be magnetic or electrostatic. In focused ion beam systems, the deflection optics are typically electrostatic. Electrostatic deflectors for focused ion beams are typically octupoles, that is, each deflector includes eight plates, distributed around the circumference of a circle. Different voltages are applied to the eight plates to deflect the beam away from the optical axis in different directions.

If the deflector is placed below the objective lens, the beam can pass through the center of the objective lens to minimize aberration. Such a configuration is used, for example, in some VisION Systems sold by FEI Company, the assignee of the present invention. Placing the deflector below the objective lens, however, increases the working distance, thereby increasing the beam aberration.

To minimize the working distance, the deflector can be placed above the objective lens. With the deflector above the lens, however, when the beam is deflected, it is moved away from the center of the lens, thereby increasing certain aberrations. To solve this problem, many focused ion beam systems use a pre-lens two-stage deflector 100 as shown in FIG. 1 to deflect a beam 102 from an optical axis 104. A first stage 110 deflects the beam 102 to one side of optical axis 104, and the second deflector 114 deflects the beam back to the other side of optical axis 104 so that the beam 102 passes through the center of an objective lens 120, but at an angle such that the beam is deflected to be in the correct position as it impacts a work piece 122. Voltages of the same magnitude are typically applied to both stages of the deflector to achieve the desired deflection.

Charged particle beams process work pieces by delivering a calculated number of particles to precise locations on the work piece. Each particle causes a change in the work piece and the ejection of secondary particles. To precisely control the processing, whether for milling or for imaging, one must control the number of particles impacting each point on the surface. As features of the work pieces processed by charged particle beams get ever smaller, charged particle beams must be able to more precisely deliver a controlled number of charged particles to each small point on the work piece surface. This precise control requires deflectors that can rapidly move a beam from pixel to pixel, while delivering the correct dose of particles to each pixel.

A significant problem occurs due to the fact that the two deflectors in the typical pre-lens deflector, referred to as an upper octupole and a lower octupole, are separated by a distance that is typically many millimeters. Because FIB ions, such as gallium ions, are relatively massive, the time it takes ions to traverse the distance between deflectors is non-negligible in comparison to short pattering dwell times. As a result, when a signal applied to a deflector system is changed to direct the beam from a first dwell point to a second dwell point, charged particles that have already passed through part of the deflection system when the voltage is changed (the upper octupole) will not receive the correct forces at the lower octupole. This will cause the charged particles to be directed to points other than either the first or the second dwell point. As dwell periods become shorter, voltage changes become more frequent, and the number of particles that are traversing the deflection system during voltages change increases, so more particles are misdirected, making it impossible to precisely process a work piece.

If the same wave-forms are applied to both deflectors, there will be "timing errors" due to the time-of-flight (TOF) it takes for the ions to travel from one deflector to the other. This leads to patterning errors that generally manifest themselves as over-shoot effects. The patterning errors are particularly obvious at lower landing energies and short dwell times. FIG. 2 shows the milling path 202 for a focused ion beam system with a beam energy of 8 kV and a 300 nanosecond dwell time.

Line 204 shows the intended beam path. Significant overshoot effects can be clearly seen wherever the beam changed direction.

These types of patterning errors are particularly problematic for circuit edit and beam chemistry applications. For example, in many circuit edit applications, very tight geometry is involved with little room for error. Also, gas-assisted etching is often required for the necessary high-aspect ratio milling involved. When using gas-assisted etching, short dwell times are needed to avoid depletion of the etching gas (with resulting degradation of milling performance) at a particular location. Because of the low tolerances involved in circuit edit, milling outside the desired beam path (as shown in FIG. 2) can result in damage to essential circuit features.

One technique for dealing with time-of-flight timing errors is described in U.S. Pat. No. 7,569,841 to Hill et al., for "Deflection Signal Compensation for Charged Particle Beam," which is assigned to the assignee of the present application and incorporated herein by reference. Hill describes a scheme that involves delaying the timing of deflection signals that are applied to the two deflector systems by an amount related to the transit time between the deflectors. This methodology works quite well but has the drawback of requiring an extra set of amplifiers (typically eight outputs) to drive an extra deflector, as well as a means of generating time-delayed versions of the deflection signals. The extra set of amplifiers results in extra deflection noise, as well as adding extra cost and complexity to the ion beam system.

Accordingly, there is a need for an improved method of correcting for TOF errors that avoids these problems of the prior art.

SUMMARY OF THE INVENTION

An object of the invention is to improve the ability of charged particle beam systems to precisely direct particles to a work piece.

As the demands for precision in charged particle beam processing increases, the time required for charged particles to move through the charged particle beam system becomes a significant factor in precisely controlling the beam. For example, when a signal applied to a deflector system is changed to direct the beam from a first dwell point to a second dwell point, charged particles that have already passed through part of the deflection system when the voltage is changed will not receive the correct forces to deflect them to either the first or the second dwell point. As dwell periods become shorter, voltage changes become more frequent, and the number of particles that are traversing the deflection system during voltages change increases, so more particles are misdirected, making it impossible to precisely process a work piece.

The invention compensates for the time required for the charged particles to traverse the system by altering one or more of the deflector signals. According to one embodiment of the invention, a digital filter is applied to the scan pattern prior to digital-to-analog (D/A) conversion in order to reduce or eliminate over-shoot effects that can result from TOF errors. In other embodiments, analog filters or the use of signal amplifiers with a lower bandwidth can also be used to compensate for TOF errors. By altering the scan pattern, over-shoot effects can be significantly reduced or eliminated.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention and advantages thereof, reference is now made to the following descriptions taken in conjunction with the accompanying drawings, in which.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

Embodiments of the present invention use a filter to reduce time-of-flight (TOF) effects for a desired scanning pattern. Preferably, a digital filter is applied to the scan pattern prior to digital-to-analog (D/A) conversion in order to reduce or eliminate over-shoot effects that can result from TOF errors. In other embodiments, analog filters or the use of signal amplifiers with a lower bandwidth can also be used to compensate for TOF errors. The invention facilitates precise delivery of charged particles in a charged particle beam system having a directable beam, and is particularly useful when the system is changing the beam position rapidly (that is, when using short dwell times) or when the beam has a lower landing energy (that is, when ions are moving slower and so take longer to travel through the deflectors). It should be noted that ion columns using extremely high mass ions (e.g., Xe) would have proportionally greater problems with the TOF artifacts described herein.

A preferred method or apparatus of the present invention has many novel aspects, and because the invention can be embodied in different methods or apparatuses for different purposes, not every aspect need be present in every embodiment. Moreover, many of the aspects of the described embodiments may be separately patentable. Although much of this description is directed at focused ion beam systems using ions such as gallium ions, preferred embodiments would also be suitable for use with charged particle beam systems using other types of ions or to other types of charged particle, including electron beam systems.

Figure 1:
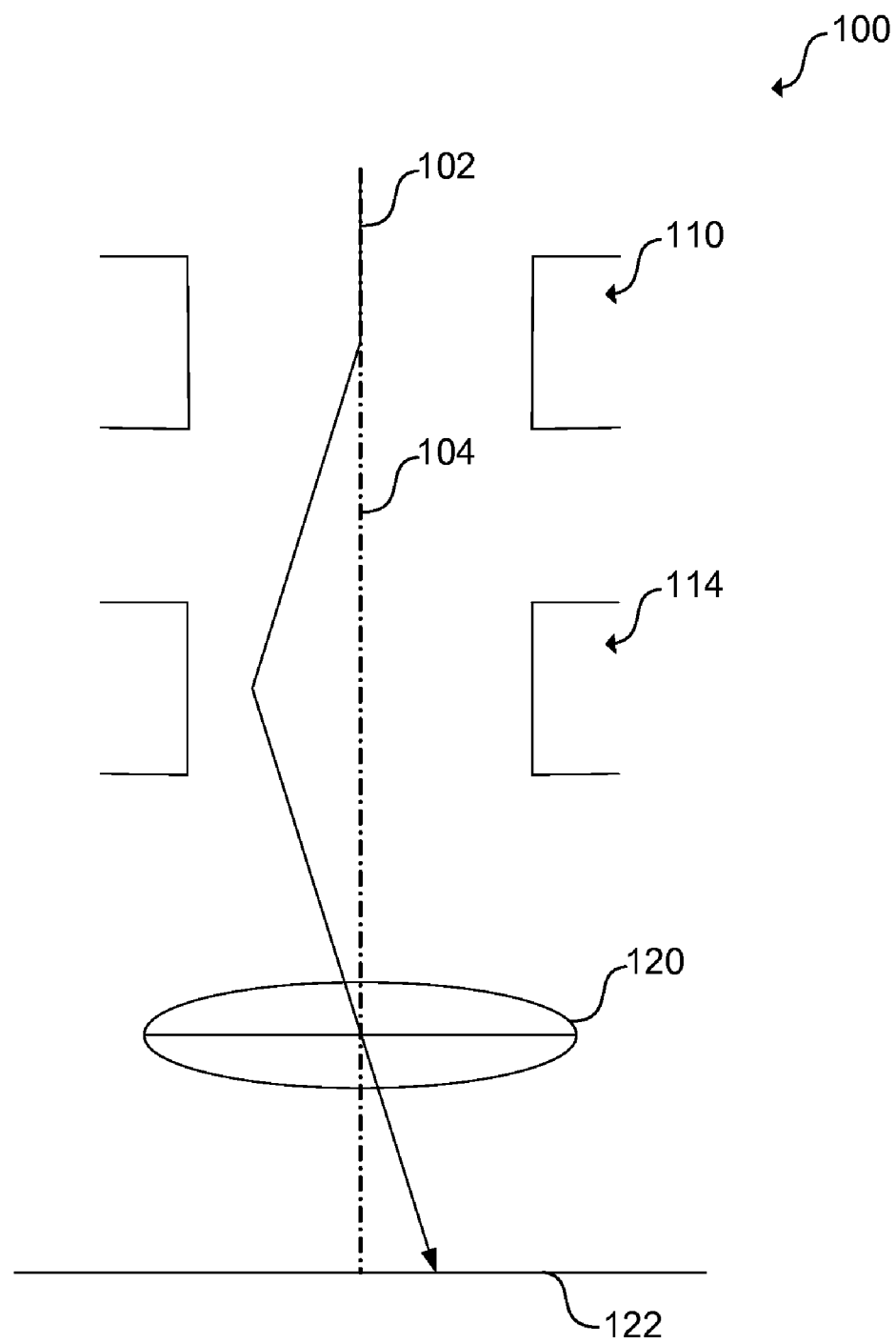
FIG. 1 shows a typical two stage deflector for a focused ion beam system.
Figure 2:
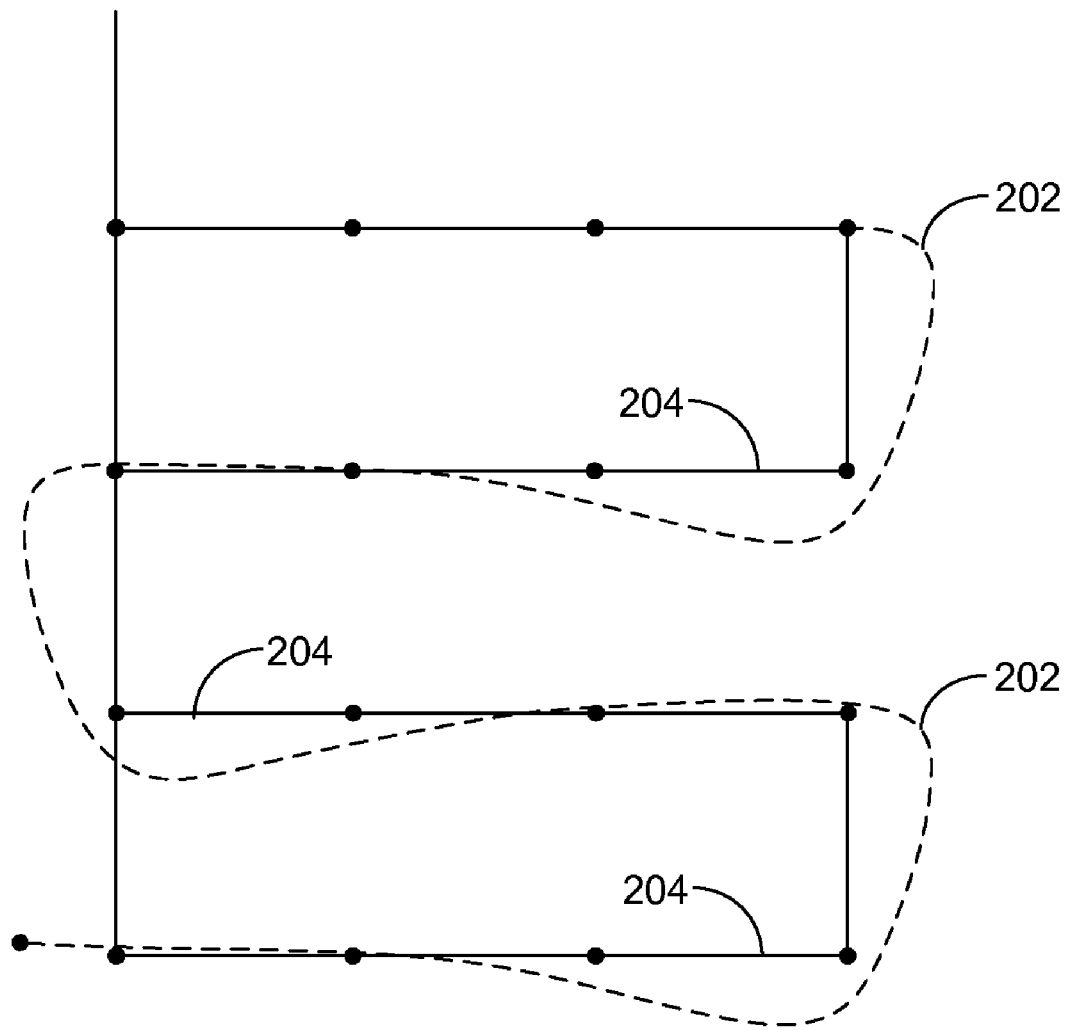
FIG. 2 shows the actual and programmed milling paths for a prior art focused ion beam system.

In a prior art deflection system, such as the two stage deflector shown in FIG. 1, the beam is moved to a different pixel by changing the voltages on both deflection stages at the same time. However, because it takes the particles a finite amount of time to pass through the deflection system, there will be particles within the system while the voltage change is occurring. Those particles will receive part of the deflection force appropriate for one pixel and part of the deflection appropriate for the next pixel. Because of the criss-cross design of the two stage deflector, the particles passing through the deflection system during the transition will typically impact not at a point between the two pixels, but at some other point. As a result, deflectors respond poorly when the frequency is sufficiently high that the transit time for the ions through the deflector is similar to the period for the driving waveform. This leads to patterning errors that generally manifest themselves as over-shoot effects as shown in FIG. 2.

A key realization that made the methodology described herein applicable is the knowledge that the TOF artifacts can be modeled in a systematic way using a frequency analysis approach. In a typical pre-lens double-deflection system as described above, in order to avoid large optical aberrations associated with deflection, the dual-deflectors are operated in a manner such that the effective pivot point of the dual deflection system is approximately at the lens plane of the final focusing lens (L2). This is generally accomplished by an upper and a lower octupole configured in a cross-wired manner to generate countering deflection, with the lowered octupole having somewhat more than 2× the deflection sensitivity and the spacing(s) and lengths arranged such that the effective deflection pivot point is in the desired location.

Consider a singly charged ion with velocity $v_{z0}$, mass m, which is traversing through a dipole deflector of length L, gap W, where w is 2*pi*frequency (pi=3.141592 . . . ). Now consider applying a sine wave voltage of amplitude $V_0 \sin(wt+\phi)$ in a symmetric manner such that whenever a voltage is applied on one plate, the opposite voltage is applied to the other plate. The force on the ion can be represented as:

$$\frac{dv_y}{dt} = a_y = \frac{2qV_0\cos(wt)}{m_i W}$$

The y-velocity on the ion as it exits the dipole, at transit time $t_1$, if the electron is arbitrarily assumed to enter the deflector at time $t_0$ is just:

$$v_y = \int_{0+t_0}^{t_1+t_0} a_y dt =$$

$$\frac{-2qV_0\sin(wt_1)}{wm_i W}\bigg|_{0+t_0}^{t_1+t_0} = \frac{-2qV_0\sin(wt_1+w_0 t_0)}{wm_i W} + \frac{2qV_0\sin(wt_0)}{wm_i W}$$

$$v_y(t_0) = \left(\frac{1}{w}\right)\left(\frac{2qV_0}{m_i W}\right)[\sin(wt_0) - \sin(wt_1+wt_0)]$$

let $t_0 = t$ $$v_y(t) = \left(\frac{1}{w}\right)\left(\frac{2qV_0}{m_i W}\right)[\sin(wt) - \sin(wt_1+wt)] =$$

$$\left(\frac{1}{w}\right)\left(\frac{2qV_0}{m_i W}\right)2\sin\left(\frac{-wt_1}{2}\right)\cos\left(\frac{2wt}{2} + \frac{wt_1}{2}\right)$$

$$v_y(t) = k'\frac{\sin\left(\frac{-wt_1}{2}\right)}{\left(\frac{wt_1}{2}\right)}\cos\left(\frac{2wt}{2} + \frac{wt_1}{2}\right)$$

The deflected angle is given as:

$$\text{Tan}(\theta) = \frac{v_y(t)}{v_{z0}}$$

$$\theta \approx \frac{v_y(t)}{v_{z0}} \text{ for small } \theta$$

and if we assume an objective lens following the deflectors has a focal length very close to the distance from the lens to the image plane (nearly parallel rays entering it), then for a focal length of $f_1$, the displacement at the image plane (sample) is just $$y \approx f_l\theta \approx f_l\frac{v_y(t)}{v_{z0}} \text{ for small } \theta$$

So:

$$y(t) = k_1 \frac{\sin\left(\frac{-wt_1}{2}\right)}{\left(\frac{wt_1}{2}\right)}\cos\left(\frac{2wt}{2} + \frac{wt_1}{2}\right)$$

The cosine term has all the time dependence. The amplitude of the deflection response and the phase response of the deflector are just:

$$y(w) = Amp[y(w; t)] = k_1\frac{\sin\left(\frac{wt_1}{2}\right)}{\left(\frac{wt_1}{2}\right)} = k_1 \cdot \text{sinc}\left[\frac{wt_1}{2\pi}\right]$$

$$\Delta\varphi = \frac{wt_1}{2}$$

where k1 is by inspection just the DC deflection sensitivity of the deflector, $\Delta\phi$ is the phase shift between input sine wave and output waveform, y(t:w) is the beam position at the sample plane, and Amp(y) is the amplitude of the envelope of the oscillating beam position at the sample plane.

For a singly charged ion which is traversing through a pre-lens double-deflection system having a unit amplitude sine wave voltage applied to the deflection system, we can use the initial result above to describe the behavior of the first deflector. Now if the first deflector is followed by a second deflector, with transit time $t_2$, which and the time elapsed to transit from the end of the first deflector to the second deflector is $t_3$, then the net deflection which occurs can be shown to be $$\Delta\varphi = \mathrm{Tan}^{-1}\left(\frac{[B_2 - A_2]}{[A_1 - B_1]}\right)$$

$$y(t; w) = k_1 \frac{\sin\left(\frac{-wt_1}{2}\right)}{\left(\frac{wt_1}{2}\right)}\cos\left(wt + \frac{wt_1}{2}\right) - k_2 \frac{\sin\left(\frac{-wt_2}{2}\right)}{\left(\frac{wt_2}{2}\right)}\cos(wt + w(t_1 + t_2/2 + t_3))$$

$$\mathrm{Amp}[y(w)] = k_1 \frac{\sin\left(\frac{-wt_1}{2}\right)}{\left(\frac{wt_1}{2}\right)}\cos\left(\Delta\varphi + \frac{wt_1}{2}\right) - k_2 \frac{\sin\left(\frac{-wt_2}{2}\right)}{\left(\frac{wt_2}{2}\right)}\cos(\Delta\varphi + w(t_1 + t_2/2 + t_3))$$

where the constants $A_{1,2}$ and $B_{1,2}$ are given as:

$$A_1 = \frac{k_2}{t_2}\sin\left(\frac{wt_2}{2}\right)\cos\left(w\left(t_1 + \frac{t_2}{2} + t_3\right)\right)$$

$$A_2 = \frac{k_2}{t_2}\sin\left(\frac{wt_2}{2}\right)\sin\left(w\left(t_1 + \frac{t_2}{2} + t_3\right)\right)$$

$$B_1 = \frac{k_1}{t_1}\sin\left(\frac{wt_1}{2}\right)\cos\left(+\frac{wt_1}{2}\right)$$

$$B_2 = \frac{k_1}{t_1}\sin\left(\frac{wt_1}{2}\right)\sin\left(+\frac{wt_1}{2}\right)$$

The table below shows sample values for a typical FIB dual deflector system.

TABLE 1

| FIB System | Length (mm) | Landing Energy (eV) | Ion Velocity (m/sec) | Transit Time (sec) | Transit Time (nSec) | Amplifier Bandwidth (MHz) |
|---|---|---|---|---|---|---|
| Total Octupole Assembly | 73.0 | 30000 | 2.9E + 05 | 2.52E-07 | 252 | NA |
| Upper Octupole | 16.0 | 30000 | 2.9E + 05 | 5.53E-08 | 55 | 7.9 |
| Lower Octupole | 38.0 | 30000 | 2.9E + 05 | 1.31E-07 | 131 | 3.3 |

Figure 3:
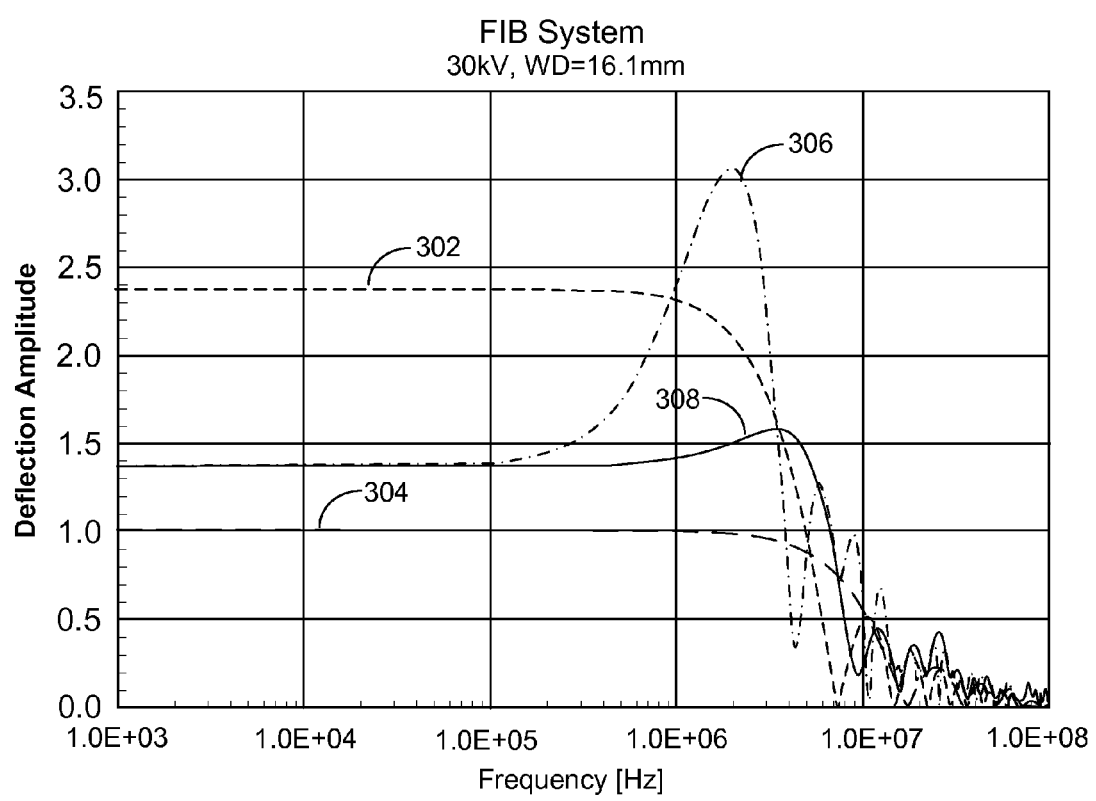
FIG. 3 shows a graph of deflection amplitude sensitivity versus frequency (Hz) for a combined octupole deflection system at a 30 kV landing energy.

For the FIB system described by Table 1, FIG. 3 shows a graph of deflection amplitude sensitivity versus frequency (Hz) for a combined octupole deflection system including the effects of the transit times within and between the octupoles as is incorporated in the equation described above. Line 302 shows the deflection sensitivity of the lower octupole alone. Line 304 shows the dependency of the upper octupole alone. As seen in the graph, the deflection sensitivity lower octupole starts dropping (rolling off) at a lower frequency due to the longer length of the lower octupole.

Line 306 shows the DC response for the combined curves for the upper and lower octupoles. At frequencies below 150 kHz, line 306 reflects the difference between the sensitivities of the upper and lower octupoles, which is expected because they are cross-wired. Above 150 kHz, however, the frequency response shows a substantial peak in the system response vs frequency curve. This pronounced peaking in the deflection amplitude response curve 306 is due to the fact that the transit time effects and deflection amplifier noise are causing the two deflectors to "add" instead of subtract.

Line 308 shows an idealized response to the combined deflectors if delay were introduced between voltages applied to the two deflectors to compensate exactly for the theoretical transition time between the octupoles as described in U.S. Pat. No. 7,569,841, discussed above.

Figure 4:
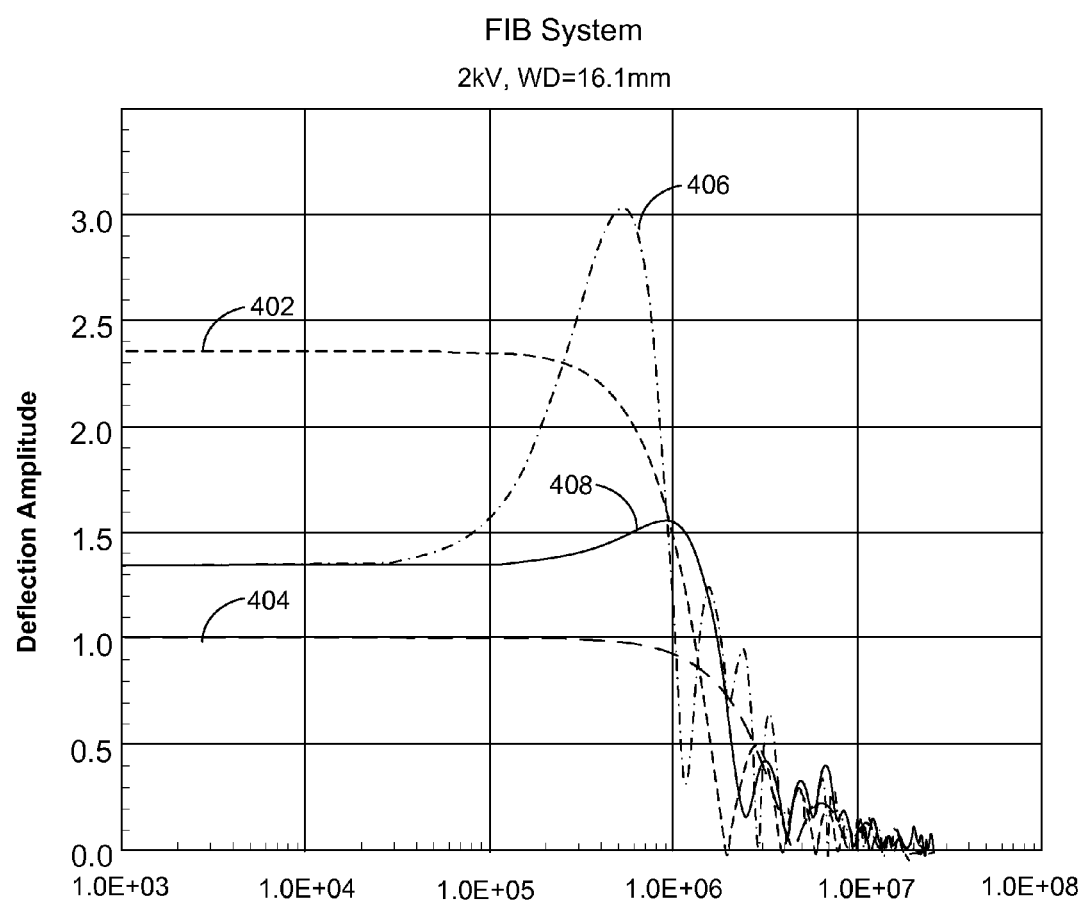
FIG. 4 shows a graph of deflection amplitude sensitivity versus frequency (Hz) for a combined octupole deflection system at a 2 kV landing energy.

A plot showing performance at 2 kV FIB landing energy is shown in FIG. 4, where all of the edges and peaks of the curves have shifted approximately sqrt(30/2) toward lower frequencies. (Line 402 shows the deflection sensitivity of the lower octupole alone; line 404 shows the dependency of the upper octupole alone; and line 406 shows the DC response for the combined curves for the upper and lower octupoles.) The frequency response of a dual-deflection system thus manifests itself as a substantial peak in the system response vs frequency curve at a gain that is typically in the 0.5 to 1.5 MHz region, depending on various details (LE, mass of ion, etc.).

Another key concept of the present invention was the realization that a useful correction scheme could be implemented in an extremely simple form, i.e. that of a simple 1-pole digital filter, which can be applied in real-time. Although the problems of over-shoot effects with ion beams with short dwell times and low landing energies are well-known, Applicants have discovered that a primary source of those problems is TOF errors as described above. Even though the need to correct these over-shoot effects has been long felt, Applicants are not aware of any previous attempts to correct these problems using digital filtering of the deflector signals.

Figure 5:
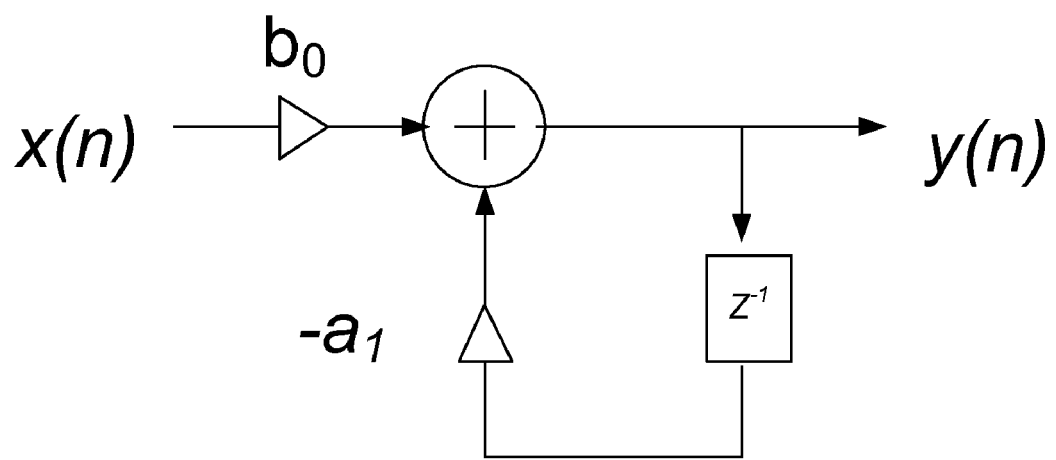
FIG. 5 is a diagram of a one-pole digital filter suitable for practicing the present invention.

According to a preferred embodiment of the present invention, a digital filter can be applied prior to generating the pattern. The digital filter to be applied can be chosen based on prior theoretical or experimental characterization in a manner so as to improve the frequency response of the entire system. The appropriate digital filter will differ as the landing energy of the system is changed. In a simple form, a 1-pole recursive (IIR) low-pass filter is applied to the desired pattern in the digital domain prior to any D/A conversion. FIG. 5 is a diagram of a suitable one-pole filter which is given by the equation:

$$y(n) = b_0 x(n) - a_1 + y(n-1)$$

where $x(n)$ is the signal input, $y(n)$ is the signal output, and $a_1$ and $b_0$ are filter coefficients chosen to have a bandwidth that will roll off the frequency response in a manner so as to avoid the large gain-peaking in the total system shown in FIGS. 3 and 4. The filtering can preferably be done in real-time. According to the preferred embodiments described above, only two multiplication and one addition operation are required per data point, although more complicated filtering is possible. As described in greater detail below, it is also possible to correct for both phase and amplitude of the combined electronics+TOF frequency response.

Figure 6:
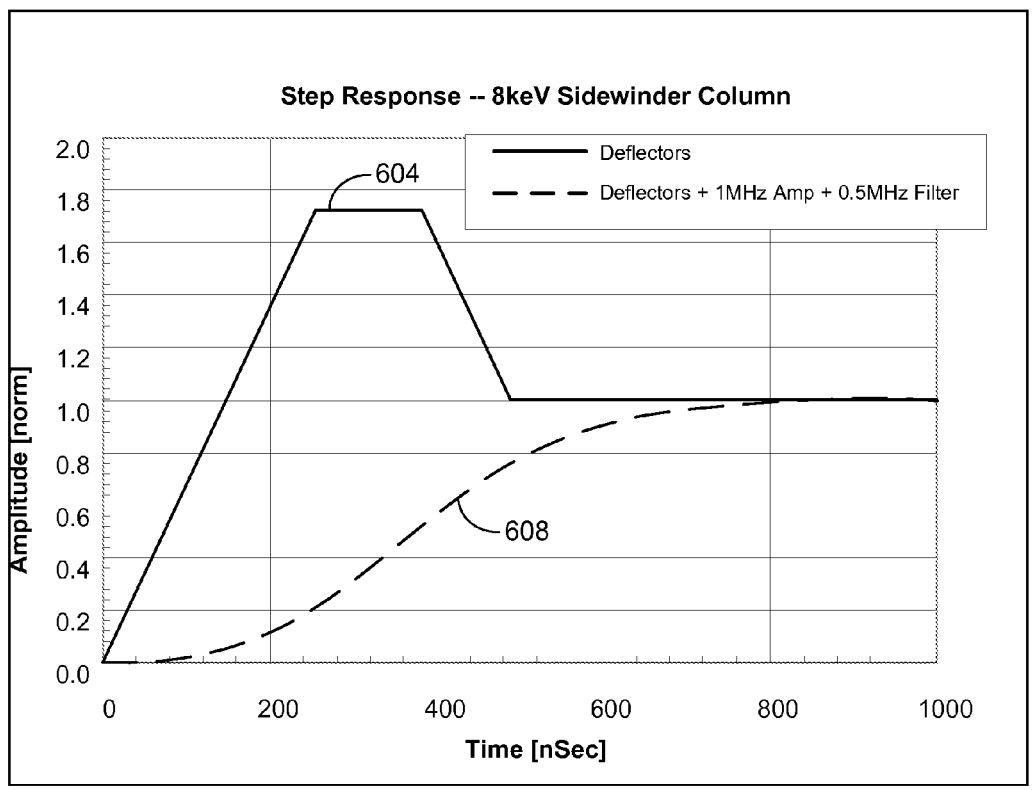
FIG. 6 shows a graph of deflection amplitude versus time for a FIB system with an 8 kV landing energy.

FIG. 6 shows, for a FIB system with an 8 kV landing energy, a graphical representation of the step response (amplitude vs. time) which can be determined from the frequency response using known Fast Fourier Transform (FFT) calculation. Alternatively, the amplitude calculation described above can be performed in the time domain. As shown by line 604, using the deflectors with no TOF correction results in a substantial overshoot in amplitude before the signal settles to the correct amplitude (at about 500 nSec). In contrast, line 608 (using a 0.5 MHz filter plus a 1 MHz amplifier) does not over-shoot the desired amplitude.

Figure 7:
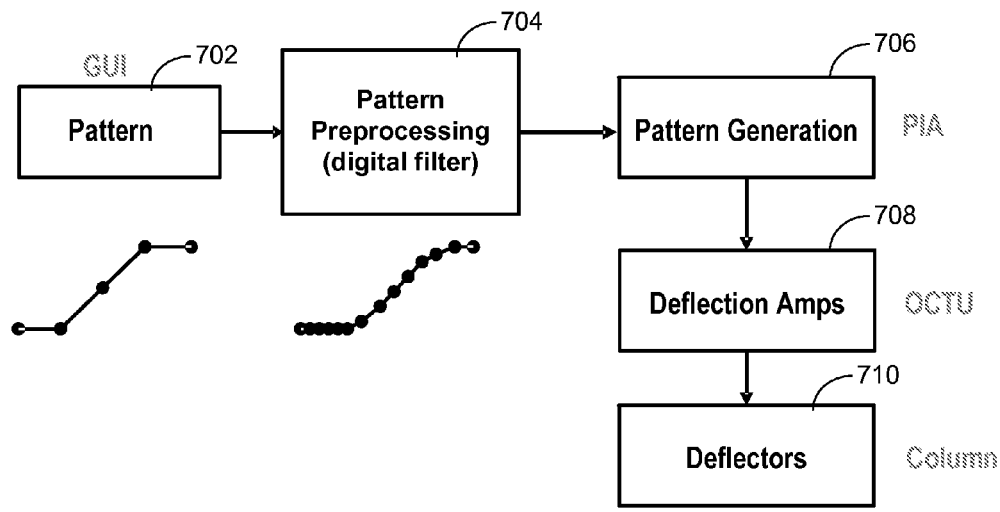
FIG. 7 shows a flow chart of a filtering scheme according to a preferred embodiment of the present invention.

The conceptual flow of the above-described filtering scheme is shown in FIG. 7. First, in step 702, a pattern to be milled is selected by a charged particle beam operator, for example by using the instrument's graphical user interface. In step 704, an appropriate digital filter is then applied to the desired pattern prior to digital-to-analog conversion. An appropriate digital filter is selected to reduce any undesirable peaking in the deflector frequency response. In step 706, the filtered signal is converted to analog and output as a stream file by the patterning engine (PIA). In step 710, the analog signal is amplified and, in step 712, sent to the deflectors to control the charged particle beam.

Figure 8:
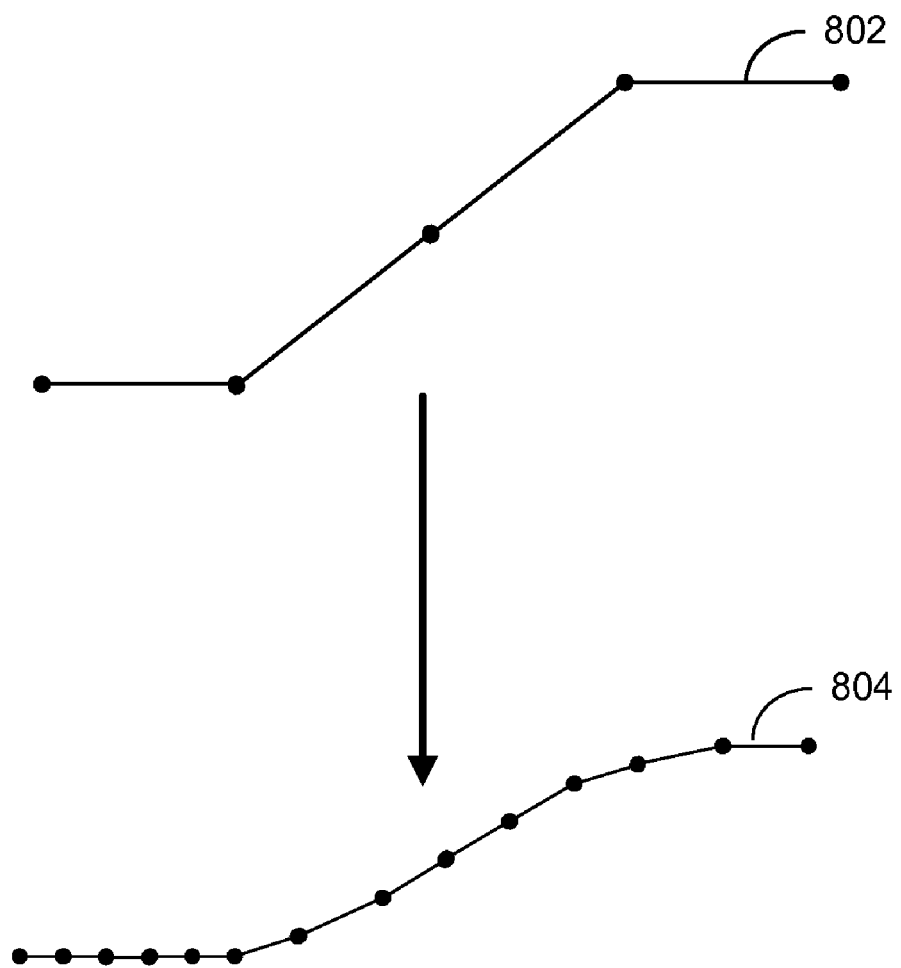
FIG. 8 illustrates the conversion of a mill pattern with a 300 nSec dwell time to a signal having a granularity of 25 nSec.

As shown by FIG. 8, the original mill pattern used a 300 nSec dwell time. Digital filtering, however, effectively lowered the signal granularity to 25 nSec.

Figure 9:
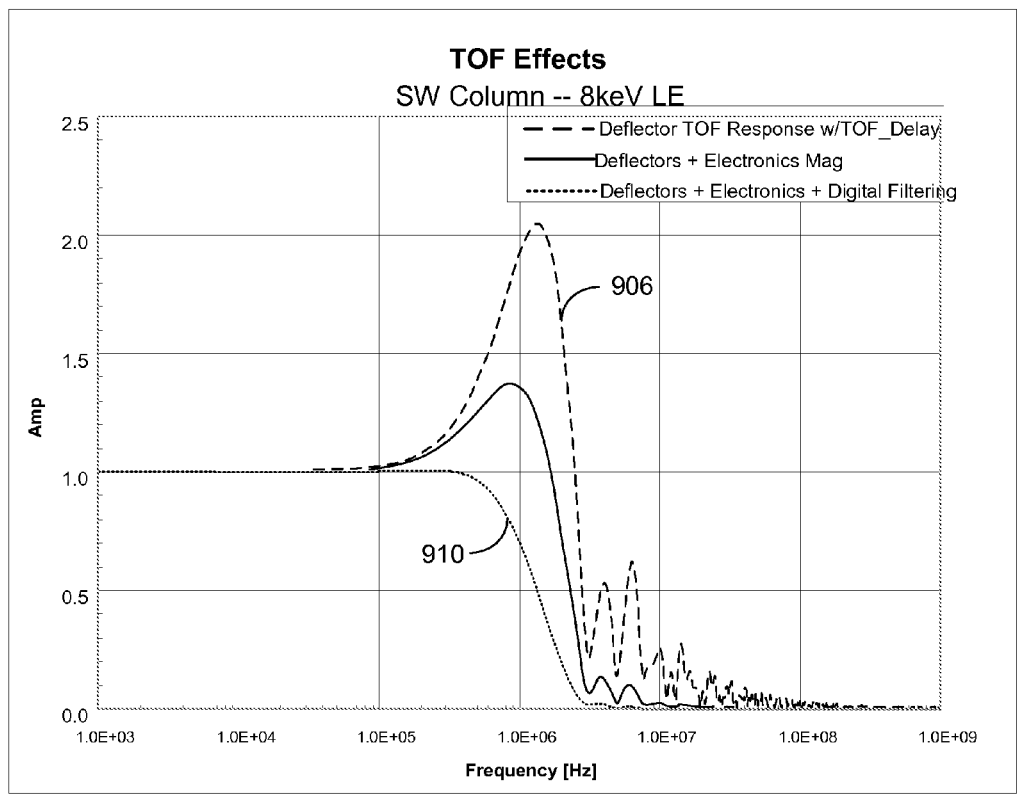
FIG. 9 is a graph of deflection amplitude sensitivity versus frequency showing the DC response for the combined octupoles and the signal response after application of a digital filter according to an embodiment of the present invention.

FIG. 9 illustrates the benefit of applying such a 1-pole IIR low-pass digital filter to the desired scanning pattern prior to any D/A conversion. Line 906 shows the DC response for the combined curves for the upper and lower octupole for a landing energy of 8 kV with the expected pronounced peak in the 0.3 to 3.0 MHz region. Line 910 shows the DC response for the combined curves after the application of a 1-pole IIR low-pass digital filter.

Figure 10A:
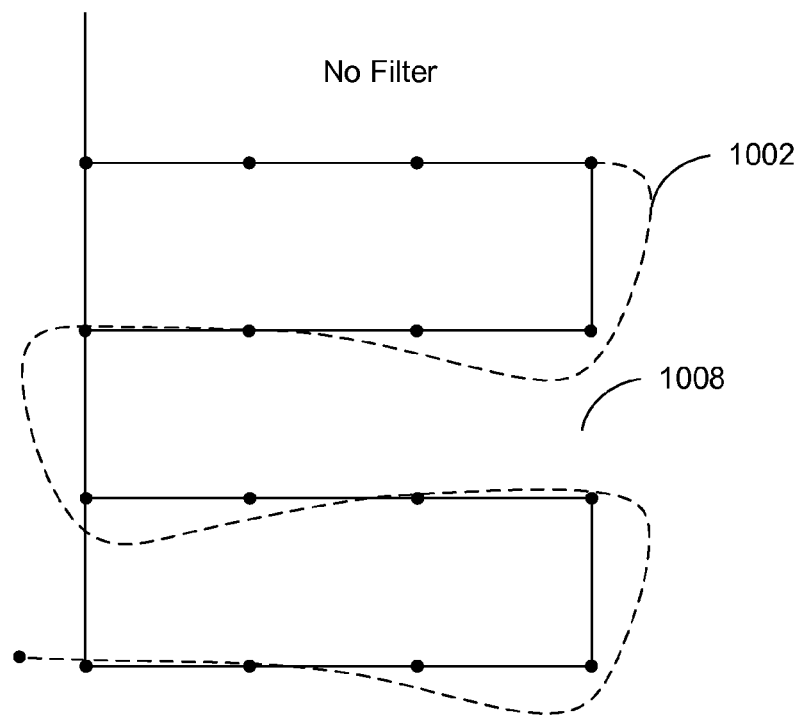
FIG. 10A shows the milling path for a prior art focused ion beam system with a beam energy of 8 kV and a 300 nanosecond dwell time.
Figure 10B:
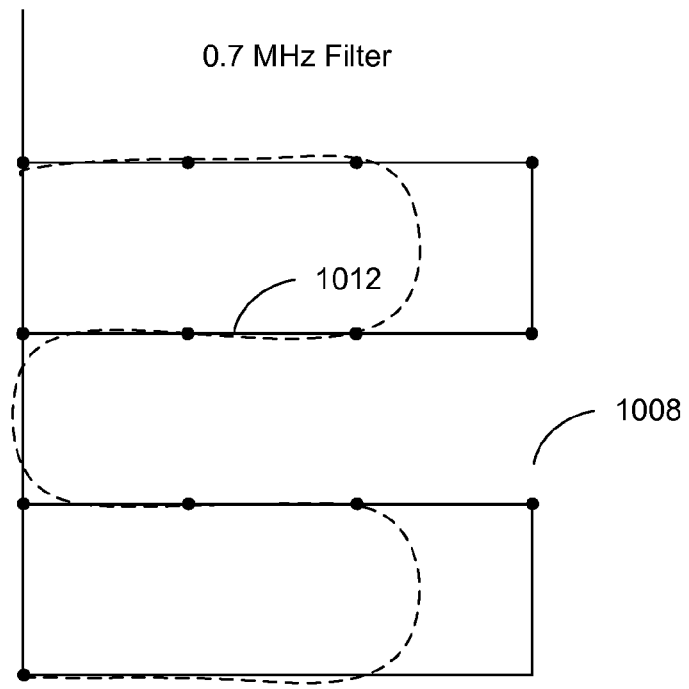
FIG. 10B shows the milling path for the focused ion beam system of FIG. 10A where a digital filter was applied to the target waveform prior to scan pattern generation.

As shown in FIG. 9, the digital filter greatly reduces the peak in the combined deflector curves. It would be expected that this reduction would greatly improve the over-shoot effects shown in FIG. 2. As shown by FIGS. 10A and 10B, this is exactly what occurs. FIG. 10A shows the milling path 1002 for a focused ion beam system with a beam energy of 8 kV and a 300 nanosecond dwell time. The intended pattern was a 4×4 serpentine pattern in a box shape. The beam pattern is intended to stay within mill box 1008, but overshoot-effects result in the beam path falling outside the mill box.

FIG. 10B shows the milling path 1012 where a digital 1-pole low pass filter (0.7 MHz) was applied to the target waveform prior to scan pattern generation. While there is still a small degree of over-shoot with respect to mill box 1018, the beam path accuracy is much improved and stays almost completely within the desired mill box 1018.

The optimum frequency to be used can vary depending upon the beam landing energy. For example, FIGS. 11A to 11D show test patterns for a focused ion beam system with a beam energy of 8 kV and a 300 nanosecond dwell time where the intended pattern was a 4×4 serpentine pattern in a box shape. These examples were produced using a standard Helios-600 focused ion beam system, available from FEI Company of Hillsboro, Oreg., the assignee of the present invention. The test consisted of determining an ideal digital filter based on a theoretical analysis. Then a stream file was created from a test pattern that was digitally filtered using simple 1-pole filters of varying frequencies. Filtered versions of the test patterns using the varying filter frequencies were constructed as modified stream files. The different stream files were used to mill the patterns shown in FIGS. 11A through 11D using the Helios-600.

Figure 11A:
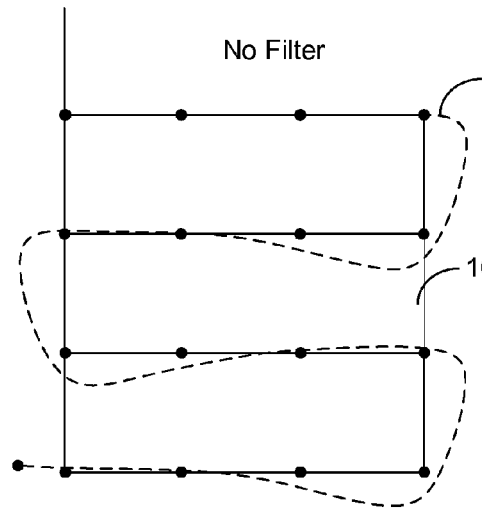
FIGS. 11A to 11D show test patterns for a focused ion beam system using varying filter frequencies.
Figure 11B:
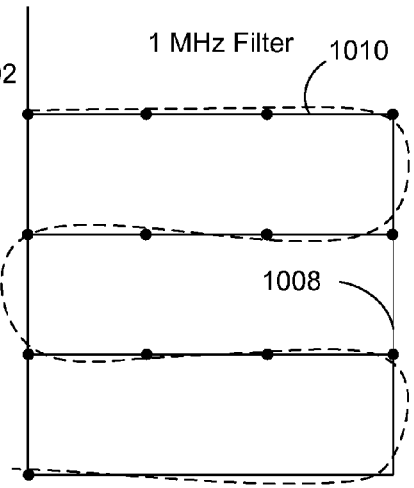
Figure 11C:
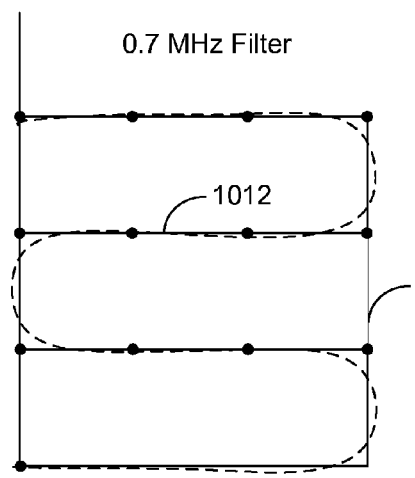
Figure 11D:
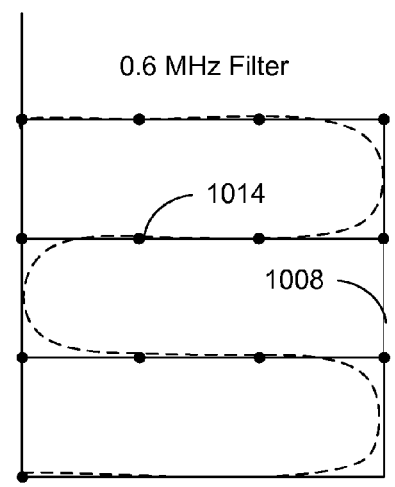

In FIG. 11A, no digital filter was used and the results were identical to FIG. 10A discussed above. In FIG. 11B, a 1.0 MHz filter was used and the over-shoot effects for mill path 1010 are reduced, but still present. In FIG. 11C, a 0.7 MHz filter was used and, as in FIG. 10B above, the beam path accuracy is much improved and stays almost completely within the desired mill box. In FIG. 11D, a 0.6 MHz filter was used and the over-shoot effects for mill path 1014 are not present at all. While the beam path in FIG. 11D does not show the sharp edges of the desired serpentine pattern (see line 204 in FIG. 2) but the beam path stays completely inside the mill box, which is particularly important for circuit edit and beam chemistry applications.

In the preferred embodiment described above, the use of the digital filters is modifying the frequency response for the entire system by flattening out pronounced peaks in the frequency response. As such, the use of this kind of digital filtering could be used for any desired patterns or landing energies. In other words, the digital filtering described above is not a pattern specific correction—although as described below, pattern specific corrections could be desirable in some circumstances. Applicants have discovered that flattening out the frequency response while ignoring phase is surprisingly effective. It appears that phase is not as important as amplitude when it comes to correcting overshoot effects via digital signal filtering.

Figure 12:
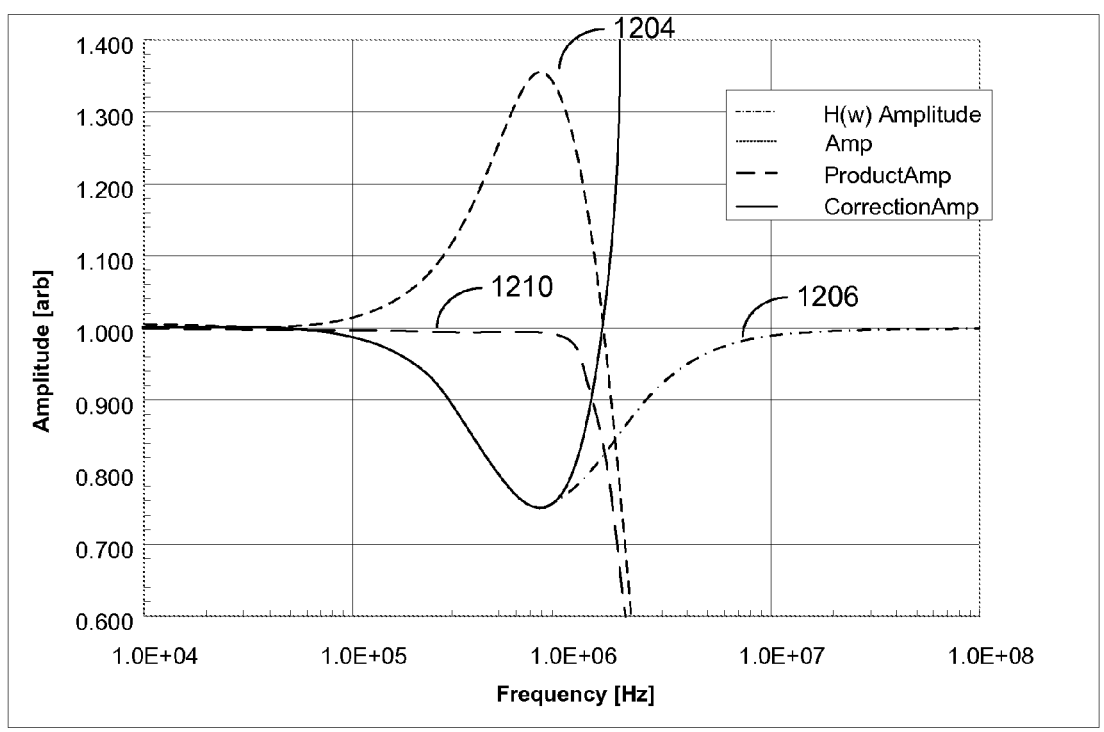
FIG. 12 is a graph of deflection amplitude sensitivity versus frequency showing the application of a digital notch filter according to a preferred embodiment of the present invention.

More sophisticated digital filtering schemes could also be used. For example, rather than a general digital filter as described above, a digital notch filter could be used to correct for an undesirable frequency response within a particular range. In FIG. 12, line 1204 shows the combined deflector response, and line 1206 shows the signal gain produced by a 2-pole Infinite Impulse Response (IIR) notch filter. Line 1210 shows the amplitude response of deflectors (plus amplifier) when followed by the notch filter. In some embodiments of the present invention, other types of known digital filters could also be used, including recursive filters or IIR filters, non-recursive filters or Finite Impulse Response Filters, or low or high pass filters. Although the preferred embodiments of the present invention described herein are either 1-pole or 2-pole filters, any number of poles could be used.

According to another preferred embodiment of the present invention, the TOF errors can also be compensated for directly. For example, the real-space beam trajectory for a given application can be calculated from a theoretical model as shown above. Deviations from the intended beam trajectory can then compared to the predicted beam trajectory. This results in an "error" trajectory that can be summed back into the initial target trajectory prior to sending it to the electronics.

Alternatively, a FFT calculation could be performed on the desired pattern (amplitude vs. time) to convert the pattern into a frequency domain representation. The known imperfect frequency response can be used to derive an ideal frequency response correction. This correction can be multiplied by the FFT of the desired pattern. The modified pattern can then be converted back to the time-domain via an inverse-FFT and sent to the deflection system.

Additionally, in some preferred embodiments, an analog electronics filter could be used to achieve results similar to the digital filtering schemes described above. Preferably, such an analog filter would provide for selectable adjustments to optimize the correction for different landing energies.

It should also be noted that the methodologies described above can be used to correct some types of electronic amplifier non-idealities as well as TOF gain peaking. For example, certain amplifiers used as a part of the digital-to-analog signal conversion that takes place during the pattern generation process can show gain peaking in the relevant frequency range and thus contribute to or even magnify the TOF artifacts. The use of such an amplifier would obviously be undesirable for low dwell time and/or low landing energy applications. However, an amplifier having such an undesirable gain could be largely compensated for using the digital filter techniques described above.

Figure 13:
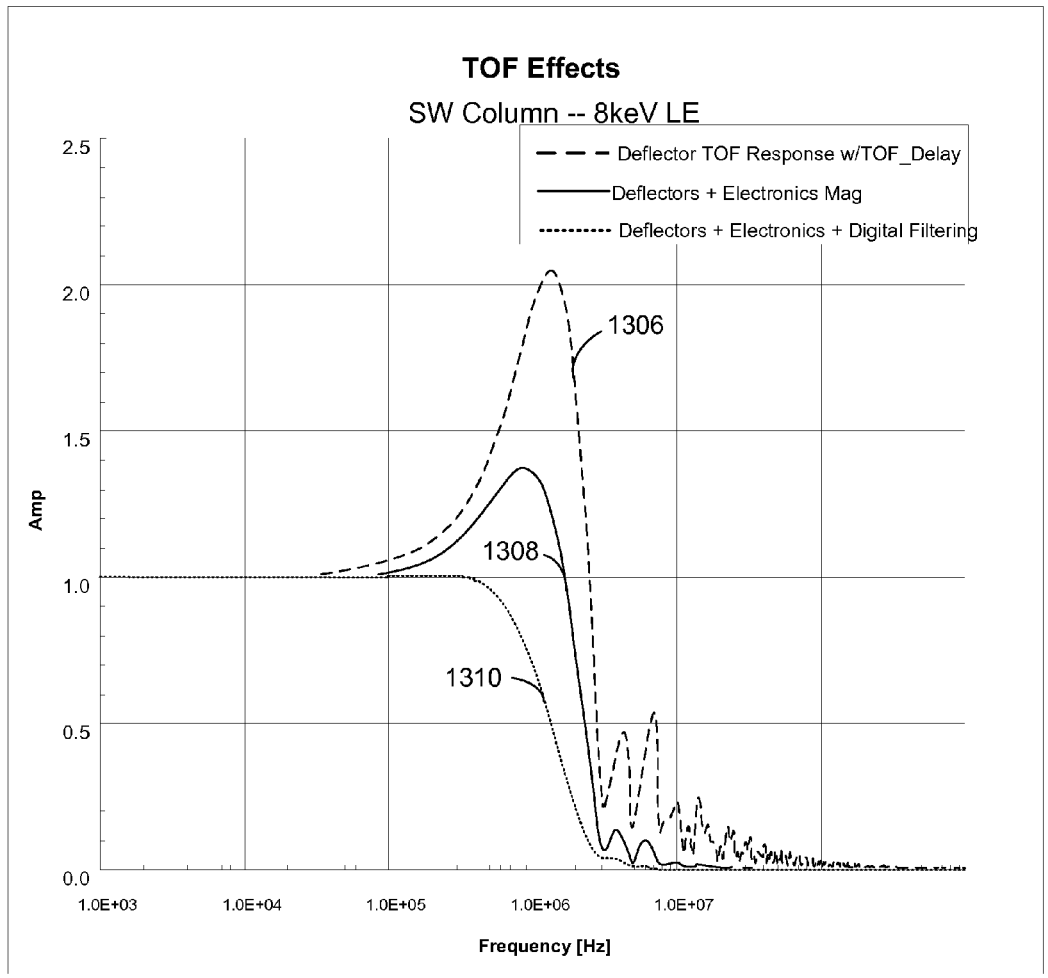
FIG. 13 is a graph of deflection amplitude sensitivity versus frequency showing the effects of using a finite amplifier with a 1 MHz bandwidth according to a preferred embodiment of the present invention.

On the other hand, it could be advantageous to use an amplifier with a lower bandwidth such that the gain rolls off in the frequency range where the undesirable signal peaking occurs. For example, FIG. 13 shows the effects of using a finite amplifier with a 1 MHz bandwidth in a FIB system using an 8 kV landing energy. Line 1306 shows the combined curves for the upper and lower octupoles in a system without taking any effects of the amplifier into consideration, and line 1308 shows the combined curves that result when the 1 MHz amplifier is used. Because the amplifier gain is already rolling off for frequencies above 1 MHz, the use of an amplifier with a limited bandwidth provides the unexpected benefit of bringing down the signal peak caused by the TOF effects. In this case, the roll-off of the amplifier gain is essentially functioning as a filter to bring down the deflector amplitude peak at those higher frequencies. Line 1310 shows the effects of combining the lower bandwidth amplifier with the digital filtering described above. As shown in the graph, the combination completely eliminates the undesirable amplitude peaking. Because a lower bandwidth amplifier might not be desirable in all applications, an amplifier which preferably has a selectable bandwidth filter could be used.

The model and embodiments described above provide examples of the invention applied to a gallium focused ion beam system; however, the invention is applicable to any charged particle beam system. The beam used to process the desired samples could comprise, for example, an electron beam, a laser beam, or a focused or shaped ion beam, for example, from a liquid metal ion source or a plasma ion source, or any other charged particle beam. Because electrons typically traverse through an electron beam system at speeds much higher than those of ions in a focused ion beam system, deflection based beam control problems are not limiting in current electron beam systems. But as specifications get tighter, particularly for low energy beams, TOF artifacts could become problematic.

The invention is not limited to a two stage deflector. For example, the digital filter could be applied to system using a single stage deflector. The invention is useful with any components of a charged particle beam system in which the separation of components that control the beam in response to electronic signals affects the beam control because of the time of flight between the components. Likewise, while most of the embodiments shown and described herein refer to or show sample milling, the invention could be applicable to any kind of sample processing, including deposition, implantation, or pure imaging applications.

Although the description of the present invention above is mainly directed at a method of directing charged particle beams, it should be recognized that an apparatus performing the operation of this method would further be within the scope of the present invention. Further, it should be recognized that embodiments of the present invention can be implemented via computer hardware or software, or a combination of both. The methods can be implemented in computer programs using standard programming techniques—including a computer-readable storage medium configured with a computer program, where the storage medium so configured causes a computer to operate in a specific and predefined manner— according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

The invention has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for carrying out the present invention are commercially available, for example, from FEI Company, the assignee of the present application. To the extent that any term is not specially defined in this specification, the intent is that the term is to be given its plain and ordinary meaning. The accompanying drawings are intended to aid in understanding the present invention and, unless otherwise indicated, are not drawn to scale.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A method of directing a charged particle beam in a charged particle beam system, comprising:
   selecting a desired scan pattern for the charged particle beam, the scan pattern for the charged particle beam being produced by applying at least a first voltage and a second voltage to at least one deflector plate in a deflector system;
   modifying the desired scan pattern by applying a digital filter to the desired scan pattern to compensate for time of flight errors resulting from charged particles being in transit through the charged particle beam system when the voltage applied is changed from the first voltage to the second voltage;
   converting the modified pattern to an analog signal;
   applying the analog signal to the deflector system in order to direct the charged particle beam.

2. The method of claim 1 in which applying a digital filter to the desired scan pattern comprises selecting a digital filter that reduces peaking in the amplitude of the deflector signal frequency response.

3. The method of claim 1 in which the digital filter is a 1-pole recursive low-pass filter.

4. The method of claim 1 in which the digital filter is a notch filter.

5. The method of claim 1 in which applying the digital filter reduces the over-shooting of the charged particle beam when the beam direction is changed.

6. The method of claim 1 in which applying the digital filter comprises applying a digital filter to flatten out the frequency response of the analog signal to be sent to the deflector system.

7. The method of claim 1 in which modifying the desired scan pattern comprises calculating projected beam deviations resulting from time of flight errors, comparing the desired scan pattern to the predicted scan pattern to create an error trajectory, and using the error trajectory to modify the desired scan pattern.

8. The method of claim 1 in which applying the analog signal to the deflector system in order to direct the charged particle beam includes applying the analog signal to the deflector system in order to direct the charged particle beam to mill a desired pattern on a sample.

9. The method of claim 1 in which applying the analog signal to the deflector system in order to direct the charged particle beam includes applying the analog signal to the deflector system in order to direct the charged particle beam to deposit material in a desired pattern on a sample.

10. The method of claim 1 in which applying a digital filter includes applying a digital filter in real time.

11. The method of claim 1 in which the charged particle beam has a landing energy of less than 30 kV.

12. The method of claim 1 in which the charged particle beam has a dwell time of less than 300 nSec.

13. An apparatus for accurately reducing time of flight errors in charged particle beam placement, comprising:
   a particle beam column for producing a beam of charged particles to process a sample;
   a deflector system for controlling the position of the charged particle beam; and
   a computer-readable memory storing computer instructions, the instructions including a program for controlling the apparatus and causing the apparatus to carry out the steps of claim 1.

14. A method of directing a charged particle beam in a charged particle beam system, comprising:
   selecting a desired scan pattern for the charged particle beam, the scan pattern for the charged particle beam being produced by applying at least a first voltage and a second voltage to at least one deflector plate in a deflector system;
   modifying the desired scan pattern to compensate for time of flight errors resulting from charged particles being in transit through the charged particle beam system when the voltage applied is changed from the first voltage to the second voltage, in which modifying the desired scan pattern comprises performing a Fast Fourier Transform (FFT) calculation to convert the desired scan pattern into a frequency domain representation, deriving an ideal frequency response correction based upon the known imperfect frequency response, multiplying the correction by the frequency domain representation, and converting the modified frequency domain representation via an inverse-FFT calculation in order to produce a modified scan pattern;
   converting the modified pattern to an analog signal;
   applying the analog signal to the deflector system in order to direct the charged particle beam.

15. A method of directing a charged particle beam in a charged particle beam system, comprising:
   selecting a desired scan pattern for the charged particle beam, the scan pattern for the charged particle beam being produced by applying at least a first voltage and a second voltage to at least one deflector plate in a deflector system;
   modifying the desired scan pattern to compensate for time of flight errors resulting from charged particles being in transit through the charged particle beam system when the voltage applied is changed from the first voltage to the second voltage, in which the digital filter is a one-pole filter adhering to the equation $y(n)=b_0 x(n) - a_1 y(n-1)$, where $x(n)$ is the signal input, $y(n)$ is the signal output, and $a_1$ and $b_0$ are filter coefficients chosen to have a bandwidth that will reduce peaks in the frequency response of two or more combined deflector curves;
   converting the modified pattern to an analog signal;
   applying the analog signal to the deflector system in order to direct the charged particle beam.

* * * * *